United States Patent [19]

Kanakarajan et al.

[11] Patent Number: 5,298,331
[45] Date of Patent: Mar. 29, 1994

[54] FLEXIBLE MULTI-LAYER POLYIMIDE FILM LAMINATES AND PREPARATION THEREOF

[75] Inventors: Kuppusamy Kanakarajan, Dublin; John A. Kreuz, Columbus, both of Ohio

[73] Assignee: E. I. Du Pont de Nemours and Company, Wilmington, Del.

[21] Appl. No.: 878,483

[22] Filed: May 5, 1992

Related U.S. Application Data

[63] Continuation-in-part of Ser. No. 571,913, Aug. 27, 1990, abandoned.

[51] Int. Cl.$^5$ .............................................. B32B 15/08
[52] U.S. Cl. .................................... 428/458; 428/473.5
[58] Field of Search ........................... 428/473.5, 458; 528/183, 185, 353

[56] References Cited

U.S. PATENT DOCUMENTS

| | | | |
|---|---|---|---|
| 3,576,691 | 4/1971 | Meyers | 156/182 |
| 3,822,175 | 7/1974 | Yaun | 161/93 |
| 3,900,662 | 8/1975 | Yaun | 428/252 |
| 4,543,295 | 9/1985 | St. Clair et al. | 428/458 |
| 4,675,246 | 6/1987 | Kundinger et al. | 428/336 |
| 4,837,300 | 6/1989 | St. Clair et al. | 528/353 |

FOREIGN PATENT DOCUMENTS

| | | |
|---|---|---|
| 0189643 | 1/1984 | European Pat. Off. |
| 0276922 | 12/1987 | European Pat. Off. |

*Primary Examiner*—Paul J. Thibodeau
*Assistant Examiner*—D. S. Nakarani

[57] ABSTRACT

Flexible multilayer polyimide metal-clad laminates, and their preparation, having at least one layer of aromatic polyimide bonded to at least one layer of a metallic substrate using a heat-sealable copolyimide adhesive containing repeating imide units derived from 4,4'-oxydiphthalic dianhydride and an aromatic ether diamine. The laminates are used in flexible printed circuits and tape automated bonding applications. Additionally, the metallic substrate may be directly coated with the copolyimide adhesive and used as a single-clad laminate for flexible printed circuits.

16 Claims, No Drawings

FLEXIBLE MULTI-LAYER POLYIMIDE FILM LAMINATES AND PREPARATION THEREOF

CROSS REFERENCE TO RELATED APPLICATION

This is a continuation-in-part of application Ser. No. 07/571,913, filed Aug. 27, 1990 and now abandoned.

BACKGROUND OF THE INVENTION

This invention relates to flexible multilayer polyimide metal-clad laminates comprising at least one layer of an aromatic polyimide and at least one layer of a metallic substrate for use in flexible printed circuits and tape automated bonding applications. The invention also relates to a process for producing these laminates.

Laminates comprising one or more layers of polyimide and one or more layers of metallic substrate material may be used for a variety of applications. For example, polyimide coated metal foils, due to the flexibility and outstanding mechanical, thermal and electrical properties of polyimides, can be used for printed electrical circuits. This is because the laminates are frequently exposed to high temperatures during further processing, for example, during soldering or drilling. The laminates also have to satisfy stringent requirements in regard to their electrical and mechanical properties.

Laminates comprising only one substrate layer of metal or metal alloy and a layer of polyimide, so called single clads, may be used for printed electrical circuits. The same applies to multilayer laminates, so called multi-clads or multilayer circuits, which comprise several metal layers and/or several polyimide layers.

Laminates containing polyimides and metal substrates are well-known in the art. Usually the polyimide layers are bonded to the metal substrate by a conventional adhesive. For example, U.S. Pat. No. 3,900,662 and U.S. Pat. No. 3,822,175 disclose bonding of polyimide to metal using an acrylate-based adhesive. However, it has been found that when conventional adhesives such as acrylates, epoxides, polyamides, phenolic resins etc. are used to bond the polyimide to the metal, the resulting laminates do not exhibit entirely satisfactory properties which meet the stringent demands often imposed. Conventional adhesives do not generally possess the high temperature heat stability of the polyimide material itself, and the strength of the adhesive bonds in multilayer laminar polyimide structures deteriorates rapidly when subjected to elevated temperatures.

On account of the disadvantages of laminates comprising layers of conventional adhesives between polyimide and metal, multilayer laminates have been proposed in which the polyimide is bonded directly to metal, i.e. without a layer of adhesive. Thus, British Patent 2,101,526 discloses the bonding of a polyimide derived from biphenyltetracarboxylic dianhydride directly to metal foil by applying heat and pressure. In other words, the polyimide is formable. It has been found, however, that such formable polyimides have inferior thermal stability to conventional non-formable polyimides.

The object of this invention is to provide flexible polyimide metal-clad laminates, which withstand high temperatures, have good adhesion, good thermal, mechanical and electrical properties and are chemically etchable (for TAB applications).

SUMMARY OF THE INVENTION

According to the present invention there is provided a flexible polyimide metal-clad suitable for use in a flexible printed circuit and tape automated bonding comprising at least one layer of a metallic substrate and at least one layer of an aromatic polyimide, said layer of polyimide being bonded on at least one side to said layer of metallic substrate with a peel strength of at least 4 pli through an adhesive layer of a heat-sealable copolyimide comprising at least 60 mole % of repeating imide units of the formula

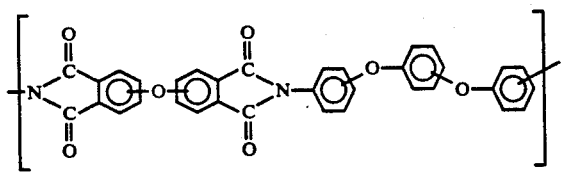

and not greater than 40 mole % of other repeating imide units of the formula

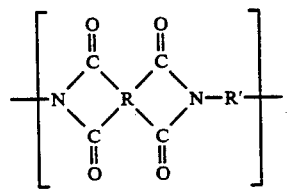

wherein R is an aromatic tetravalent organic radical and R' is a divalent radical of an aromatic or aliphatic diamine containing at least two carbon atoms, the two amino groups of said diamine each being attached to a separate carbon atom of said divalent radical.

A further embodiment of the invention relates to a polyimide laminate comprising a layer of a metallic substrate coated on one or both sides with the aforesaid copolyimide adhesive suitable for use as a single-clad laminate for flexible printed circuits.

A still further embodiment of the invention relates to a process for preparing an adherable all-polyimide laminate for use in making metal-clads comprising coating a copolyamic acid adhesive directly either on a fully cured polyimide base film, or on a partially cured polyimide gel or green film or by coextruding the copolyamic acid with the polyimide base film and then curing to form the copolyimide.

DETAILED DESCRIPTION OF THE INVENTION

The polyimide film metal-clad laminates of the present invention comprise at least one layer of a polyimide base film which on at least one of its two sides is bonded to a metal using a heat-sealable copolyimide adhesive as specifically defined hereinafter. Alternatively, the copolyimide adhesive may be directly bonded to one or both sides of the metal substrate.

The polyimide base films used in the laminates of the invention are preferably about 0.3 to 5 mils in thickness and can be obtained from polyamic acid precursors derived from the reaction of suitable diamines with suitable dianhydrides in the manner described in, for example, U.S. Pat. No. 3,179,614.

Dianhydrides which can be used in the polyimide base film include:
pyromellitic dianhydride;
3,4,9,10-perylene tetracarboxylic dianhydride;
naphthalene-2,3,6,7-tetracarboxylic dianhydride;
naphthalene-1,4,5,8-tetracarboxylic dianhydride;
bis(3,4-dicarboxyphenyl) ether dianhydride;
bis(3,4-dicarboxyphenyl) sulfone dianhydride;
2,3,2',3'-benzophenonetetracarboxylic dianhydride;
bis(3,4-dicarboxyphenyl) sulfide dianhydride;
bis(3,4-dicarboxyphenyl) methane dianhydride;
2,2-bis(3,4-dicarboxyphenyl) propane dianhydride;
2,2-bis(3,4-dicarboxyphenyl) hexafluoropropane;
3,4,3',4'-biphenyltetracarboxylic dianhydride;
2,6-dichloronaphthalene-1,4,5,8-tetracarboxylic dianhydride;
2,7-dichloronaphthalene-1,4,5,8-tetracarboxylic dianhydride;
2,3,6,7-tetrachloronaphthalene-1,4,5,8-tetracarboxylic dianhydride;
phenanthrene-1,8,9,10-tetracarboxylic dianhydride;
pyrazine-2,3,5,6-tetracarboxylic dianhydride;
benzene-1,2,3,4-tetracarboxylic dianhydride; and
thiophene-2,3,4,5-tetracarboxylic dianhydride.

Diamines which can be used together with the dianhydrides in the polyimide base film include the following:
meta-phenylenediamine;
para-phenylenediamine;
2,2-bis(4-aminophenyl) propane;
4,4'-diaminodiphenylmethane;
4,4'-diaminodiphenyl sulfide;
4,4'-diaminodiphenyl sulfone;
3,3'-diaminodiphenyl sulfone;
4,4'-diaminodiphenyl ether;
2,6-diaminopyridine;
bis(3-aminophenyl) diethyl silane;
benzidine;
3,3'-dichlorobenzidine;
3,3'-dimethoxybenzidine;
4,4'-diaminobenzophenone;
N,N-bis(4-aminophenyl)-n-butylamine;
N,N-bis(4-aminophenyl) methylamine;
1,5-diaminonaphthalene;
3,3'-dimethyl-4,4'-diaminobiphenyl;
m-aminobenzoyl-p-aminoanilide;
4-aminophenyl-3-aminobenzoate;
N,N-bis(4-aminophenyl) aniline;
2,4-bis(beta-amino-t-butyl) toluene;
bis(p-beta-amino-t-butylphenyl) ether;
p-bis-2-(2-methyl-4-aminopentyl) benzene;
p-bis(1,1-dimethyl-5-aminopentyl) benzene;
m-xylylenediamine;
p-xylylenediamine;
position isomers of the above, and mixtures thereof.

The preparation of polyimides and polyamic acids is more fully described in U.S. Pat. No. 3,179,614 and U.S. Pat. No. 3,179,634.

A particularly preferred polyimide base film is derived from 4,4'-diaminodiphenyl ether and pyromellitic dianhydride.

The heat-sealable copolyimide adhesives used in the present invention may be either random or block and contain at least 60 mole % of repeating imide units of the formula

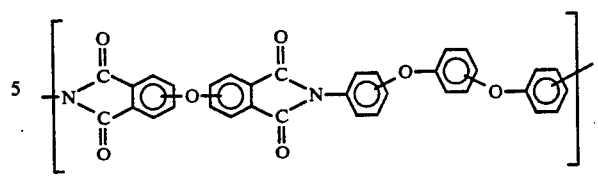

and not greater than 40 mole % of other repeating imide units of the formula

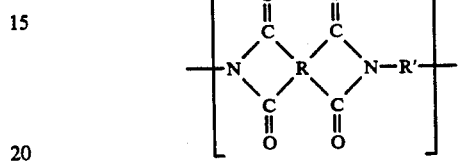

wherein R is an aromatic tetravalent organic radical and R' is a divalent radical of an aromatic or aliphatic diamine containing at least two carbon atoms, the two amino groups of the diamine each being attached to separate carbon atoms of the divalent radical.

The heat-sealable copolyimide adhesive contains at least 60 mole %, preferably from 40 to 80 mole % and, most preferably, from 70 to 80 mole % of imide units derived from 4,4'-oxydiphthalic dianhydride (ODPA) and an aromatic ether diamine of the formula

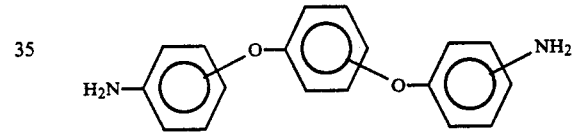

If the percentage of such imide units is lower than 60 mole %, it is difficult to obtain copolyimide adhesives having glass transition temperatures less than 250° C. and good adhesion on the substrates.

Representative aromatic ether diamines include:
1,2-bis(4-aminophenoxy)benzene
1,3-bis(4-aminophenoxy) benzene
1,2-bis(3-aminophenoxy)benzene
1,3-bis(3-aminophenoxy) benzene
1-(4-aminophenoxy)-3-(3-aminophenoxy) benzene
1,4-bis(4-aminophenoxy) benzene
1,4-bis(3-aminophenoxy) benzene
-(4-aminophenoxy)-4-(3-aminophenoxy) benzene The addition of up to 40 mole %, preferably from 2 to 25 mole %, and most preferably from 5 to 15 mole % of additional imide units of the formula

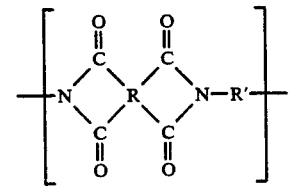

wherein R and R' are as previously defined above, to the copolyimide adhesive provides the requisite low glass transition temperature (<250° C.) and thermal stability of adhesion properties (>4 pli) without reducing the good thermal, mechanical and electrical properties characteristic of the polyimide.

Such additional imide units may be derived from dianhydrides and diamines which are the same or different from the 4,4'-oxydiphthalic dianhydride and aromatic ether diamines previously defined.

Particularly preferred dianhydrides and diamines include the following:
pyromellitic dianhydride;
4,4'-oxydiphthalic dianhydride;
3,3'4,4'-benzophenone tetracarboxylic dianhydride;
2,2',3,3'-benzophenone tetracarboxylic dianhydride;
3,3',4,4'-biphenyl tetracarboxylic dianhydride;
2,2',3,3'-biphenyl tetracarboxylic dianhydride;
2,2-bis(3,4-dicarboxyphenyl) hexafluoropropane dianhydride;
bis(3,4-dicarboxyphenyl) sulfone dianhydride;
bis(3,4-dicarboxyphenyl) sulfide dianhydride;
bis(2,3-dicarboxyphenyl) methane dianhydride;
bis(3,4-dicarboxyphenyl) methane dianhydride;
1,1-bis(2,3-dicarboxyphenyl) ethane dianhydride;
1,1-bis(2,3-dicarboxyphenyl) propane dianhydride;
2,2-bis(3,4-dicarboxyphenyl) propane dianhydride;
m-phenylene bis(trimellitate)dianhydride;
hexamethylene diamine;
heptamethylenediamine;
3,3'-dimethylpentamethylenediamine;
3-methylhexamethylenediamine;
3-methylheptamethylenediamine;
2,5-dimethylhexamethylenediamine;
octamethylenediamine;
nonamethylenediamine;
1,1,6,6-tetramethylhexamethylenediamine;
2,2,5,5-tetramethylhexamethylenediamine;
4,4-dimethylheptamethylenediamine;
decamethylenediamine;
meta-phenylenediamine;
4,4'-diaminobenzophenone;
4-aminophenyl-3-aminobenzoate;
m-aminobenzoyl-p-aminoanilide;
4,4'-diaminodiphenylether;
3,4'-diaminodiphenylether;
bis(4-aminophenyl)methane;
1,1-bis(4-aminophenyl) ethane;
2,2-bis(4-aminophenyl) propane;
4,4'-diaminodiphenyl sulfoxide;
3,3'-diaminobenzophenone;
1,3-bis(4-aminophenoxy)benzene;
2,2'-diaminobenzophenone;
1,2-bis(4-aminophenoxy)benzene;
1,3-bis(4-aminobenzoyloxy)benzene;
4,4'-diaminobenzanilide;
4,4'-bis(4-aminophenoxy)phenyl ether;
2,2'-bis(4-aminophenyl)hexafluoropropane;
2,2-bis(4-aminophenyl)-1,3-dichloro-1,1,3,3-tetrafluoropropane;
4,4'-diaminodiphenyl sulfone;
1,12-diaminododecane;
1,13-diaminotridecane;
polysiloxane diamine of the formula

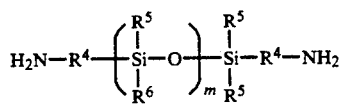

wherein $R_4$ is lower alkylene aralkylene or phenylene, $R_5$ is lower alkyl or phenyl, $R_6$ is lower alkyl or phenyl and m is 1 to 100. The term "lower" includes from 1 to 3 carbon atoms.

Particularly preferred copolyimide adhesives of the invention contain from 70 to 95 mole % of oxydiphthalic dianhydride, 5 to 30 mole % of pyromellitic dianhydride and 100 mole % of 1,3-bis(4-aminophenoxy)benzene and from 80 to 95 mole % of 1,3-bis(4-aminophenoxy)benzene, 5 to 20 mole % of hexamethylene diamine and 100 mole % of oxydiphthalic dianhydride.

The copolyimide adhesives of the present invention exhibit excellent physical properties including an elastic modulus of under 400 kpsi to provide the necessary conformability, a low coefficient of thermal expansion (<100 ppm), dielectric constant (<3.5), dielectric strength (2.5–3.5 volts/mil), dissipation factor (0.001–0.01), water absorption (<2.5%) and solder resistance.

Chemical etchability of the copolyimide adhesive can be obtained by chemically converting the precursor polyamic acid using conversion chemicals such as acetic anhydride and beta-picoline. The chemically converted copolyimide adhesive, when coated on chemically converted polyimide base film, provides a chemically etchable film laminate which can be used in TAB applications. Chemical etchability can also be achieved by incorporating ester functionality in the adhesive backbone using a diester diamine (RDEDA) or a diester dianhydride (MPBTDA) as comonomer.

Ideally the adhesives are cured at temperatures ranging from 150° C. to 400° C. by raising the temperature in increments of 5° C./min to 300° C. over 90 minutes and heating at 400° C. for 5 minutes and then laminated at 350° C. to obtain high bond strengths. Higher cure temperatures tend to reduce the bondability of the adhesive. Longer residence times at high temperatures also reduce the bond strength.

For example, the adhesive ODPA/PMDA:RODA (80/20:100) when coated on polyimide green film and cured at 150°–300° C. and laminated to copper foil at 350° C. for 20 min and 150 psi pressure gave a peel strength of 12 pli. When the same film is cured at 400° C. for an additional 5 minutes and laminated at 350° C., the peel strength dropped to 10 pli. Longer than 10 minutes curing at 400° C. may cause reduced bond strengths. The polyimide laminates of the present invention can be prepared by applying a thin coating of a copolyamic acid precursor of the desired copolyimide described above to the polyimide base film or directly to a metallic substrate and thereafter treating the coated polyimide base film or coated metallic substrate to completely convert the polyamic acid precursor to polyimide. Coating thicknesses range from 0.1 to 2 mil. The base polyimide film will of course be different from the coating polyimide.

The copolyamic acid precursors are prepared by reacting approximately equimolar amounts of the aforesaid dianhydrides and diamines in an inert organic solvent such as N,N-dimethylacetamide or N-methylpyrrolidone. Other organic solvents such as N,N-dimethylformamide, dimethyl sulfoxide, xylene, toluene and tetrahydrofuran can also be used as cosolvents.

The polyamic acids can be converted to polyimides by either a thermal conversion process or a chemical conversion process using a dehydrating agent and a catalyst to give distinct products having different adhesive characteristics.

Copolyimide adhesive coatings can be applied to fully cured polyimide base film or to one of the intermediate manufacturing stages such as to "gel" film or to "green" film.

The term "gel" film refers to a sheet polyimide material which is laden with volatiles, primarily solvent, to such an extent that the polyimide is in a gel-swollen, plasticized, rubbery condition. The volatile content is usually in the range of 80 to 90% by weight and the polymer content usually in the range of 10 to 20% by weight of the gel film. The film becomes self-supporting in the gel film stage and can be stripped from the support on which it was cast and heated. The gel film generally has an amic acid to imide ratio between 90:10 and 10:90.

The gel film structure can be prepared by the method described in U.S. Pat. No. 3,410,826 by mixing a chemical converting agent and a catalyst, such as a lower fatty acid anhydride and a tertiary amine, respectively, into the polyamic-acid solution at a low temperature, followed by casting the polyamic-acid solution in film-form, on a casting drum and mildly heating the cast film at, for example, 100° C. to activate the conversion agent and catalyst for transforming the cast film to a polyamic acid-polyimide gel film.

Another type of polyimide base film which can be coated with the copolyimide adhesive is "green film" which is all polyamic acid or which has a very low polyimide content. Green film contains generally about 50 to 75% by weight polymer and 25 to 50% by weight solvent and is sufficiently strong to be self-supporting.

Green film can be prepared by casting the polyamic acid solution into film form onto a suitable support such as a casting drum or belt and removing the solvent by mild heating at up to 150° C. A low proportion of amic acid units in the polymer, e.g., up to 25%, may be converted to imide units.

Application of the copolyamic acid coating can be accomplished in any number of ways, such as by slit die, dipping or kiss-roll coating, followed by metering with doctor knife, doctor rolls, squeeze rolls or air knife. It may also be applied by brushing or spraying.

Using such techniques, it is possible to prepare both one- and two-side coated structures. In preparation of the two-side coated structures, one can apply the coatings to the two sides either simultaneously or consecutively before going to the curing and drying stage.

In another embodiment, the polyamic acid adhesive solution can be coextruded onto one or both sides of the polyamic acid gel base or green film and the polyamic acid layer(s) subsequently cured by heat treatment.

In a further embodiment, the polyamic acid adhesive may be coated on a fully cured polyimide base film or directly on a metal substrate and subsequently imidized by heat treatment. The polyimide base film may be prepared by either a chemical or thermal conversion process and may be surface treated, e.g. by chemical etching, corona treatment, laser etching etc., to improve adhesion.

A single polyimide metal-clad of the present invention comprises a flexible copolyimide layer which adheres to a metal foil such as copper, aluminum, nickel, steel or an alloy containing one or more of these metals as a substantial constituent, or to a foil of amorphous metal. The copolyimide layer adheres firmly to the metal and has a high peel strength of 4 pli and higher. The metals do not have to be used as elements in pure form, i.e. it is also possible to use substrates of metal alloys, such as alloys containing nickel, chromium or iron or nickel and copper, or of amorphous alloys containing iron. Particularly suitable metallic substrates are foils of rolled, annealed or electrodeposited copper or rolled, annealed copper alloy. In many cases, it has proved to be of advantage to pretreat the metallic substrate before coating. The pretreatment may consist of a chemical treatment or a mechanical roughening treatment. It has been found that this pretreatment enables the adhesion of the copolyimide layer and, hence, the peel strength to be further increased. Apart from roughening the surface, the chemical pretreatment may also lead to the formation of metal oxide groups, enabling the adhesion of the metal to the copolyimide layer to be further increased. It has been found that approximately a 0.2 pli increase in peel strength results for each microinch increase of surface roughness.

A polyimide multi-clad of the present invention comprising a double side copper clad can be prepared by laminating copper foil to both sides of an adhesive coated dielectric polyimide film. The construction can also be made by laminating adhesive coated copper foil to both sides of a dielectric polyimide film or to an adhesive coated dielectric polyimide film.

The advantageous properties of this invention can be observed by reference to the following examples which illustrate, but do not limit, the invention. All parts and percentages are by weight unless otherwise indicated.

GLOSSARY

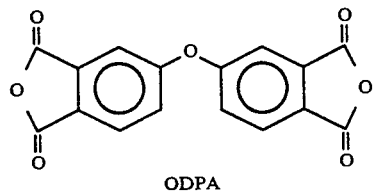

ODPA

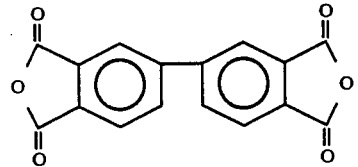

BPDA

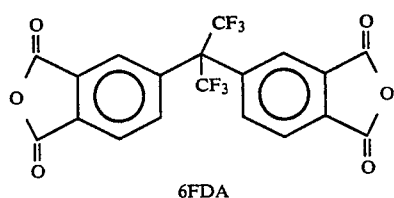

6FDA

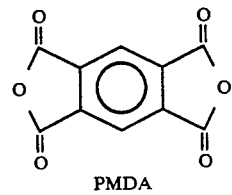

PMDA

-continued
GLOSSARY

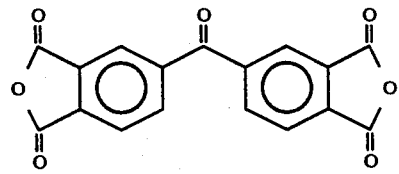
BTDA

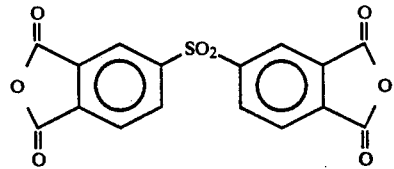
DSDA

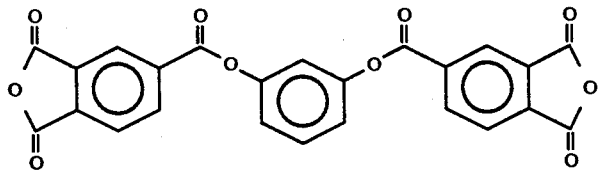
MPBTDA

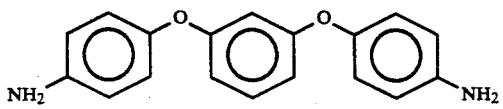
RODA

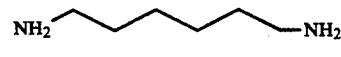
HMD

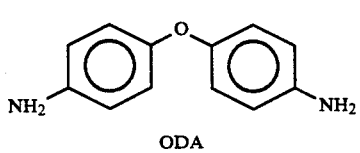
ODA

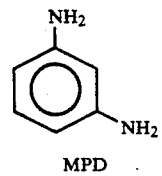
MPD

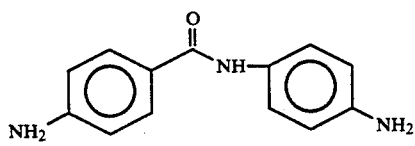
DABA

POLYSILOXANE DIAMINE
SIODA

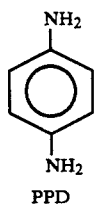
PPD

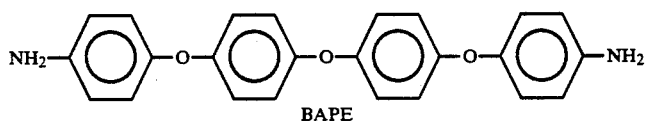
BAPE

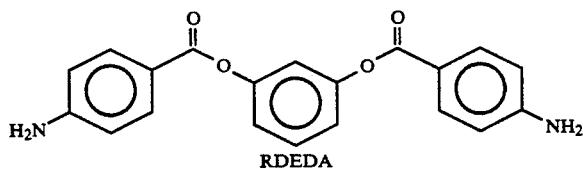
RDEDA

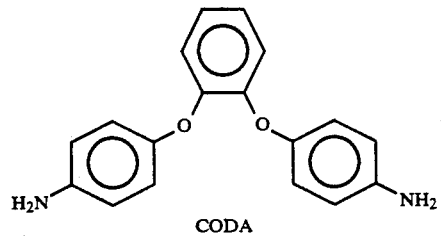
CODA

EXAMPLES 1–30

Polyamic acid solutions were prepared by reacting the appropriate molar equivalents of the monomers in dimethylacetamide (DMAC) solvent. Typically, the diamine(s) (0.05 mole) dissolved in DMAC were stirred under nitrogen and the dianhydride(s) (0.05 mole) were added as solid over a period of several minutes. Stirring was continued to obtain maximum viscosity of the copolymer. The viscosity was adjusted by controlling the amount of dianhydride in the polyamic acid composition.

The copolyamic acids were coated on a fully cured corona treated polyimide base film derived from pyromellitic dianhydride and 4,4'-diaminodiphenyl ether and converted to copolyimide either by a thermal conversion process or by a chemical conversion process using acetic anhydride as dehydrating agent and betapicoline as a catalyst to provide distinct products having different adhesive characteristics.

The copolyamic acids were coated on the base polyimide film using a coating bar to a thickness of 0.5 mils and the solvent removed by heating at 80° C. for 20 minutes. The coated polyimide films were placed on a pin frame and Examples 1 to 19 were cured at 160° to 220° C. and Examples 20 to 30 were cured at 160° to 260° C. for 90 minutes.

The coated polyimide films were subsequently laminated to roll-annealed copper at temperatures of 250° C., 300° C. and 350° C. to form the copper-clads.

Roll clads could also be made by continuous lamination of the adhesive coated dielectric film to copper foil using a high temperature double belt press or a high temperature nip roll laminator.

Peel strength results of the polyimide copper-clad laminates were determined by ASTM method IPC-TM-650, Method No. 2.4.9B and are given in Tables I and II.

TABLE 1

Peel Strength of Chemically Converted Adhesive on Corona Treated 2 mil PMDA/ODA Polyimide Film

| Example No. | Adhesive Composition (mole %) | Peel Strength (pli) 250° C. | 300° C. | 350° C. | Tg (°C.) |
|---|---|---|---|---|---|
| Control | ODPA:RODA | 1.0 | 4.4 | 4.8 | 215 |
|  | 100:100 |  |  |  |  |
|  | ODPA:RODA/SiODA |  |  |  |  |
| 1 | 100:95/5[a] |  | 2.9 | 4.6 | 202 |
| 2 | 100:90/10[a] |  | 1.3 | 3.2 | 190 |
|  | ODPA/PMDA:RODA |  |  |  |  |
| 3 | 70/30:100[a] |  | 3.9 | 4.5 | 220 |
| 4 | 80/20:100[b] | 2.2 | 8.4 | 6.4[c] | 225 |
| 5 | 90/10:100[a] |  | 3.9 | 5.5[c] | 222 |
|  | ODPA:RODA/HMD |  |  |  |  |
| 6 | 100:90/10[a] |  | 4.8 | 5.4[c] | 209 |
| 7 | 100:80/20[a] |  | 3.8 | 4.3 | 201 |
|  | ODPA/6FDA:RODA |  |  |  |  |
| 8 | 90/10:100[a] | 4.9 | 4.0 | 4.5 | 221 |
| 9 | 80/20:100[a] | 4.3 | 5.2[c] | 7.6[c] | 227 |
| 10 | 70/30:100[a] | 4.1 | 4.9 |  | 232 |
|  | ODPA/PMDA:RODA/HMD |  |  |  |  |
| 11 | 90/10:90/10[a] | 4.2 | 4.4 | 4.8[c] | 210 |
| 12 | 80/20:80/20[a] | 3.6 | 5.3 | 4.9 | 204 |
|  | ODPA/6FDA/PMDA:RODA |  |  |  |  |
| 13 | 70/15/15:100[b] | 1.44 | 3.8 | 3.6 | 230 |
| 14 | 60/20/20:100[b] | 1.5 | 3.3 | 4.3 | 235 |
|  | ODPA/PMDA:RODA/SiODA |  |  |  |  |
| 15 | 80/20:95/5[a] | 3.5 | 4.7 |  | 215 |
| 16 | 80/20:90/10[b] | 4.2 | 3.0 |  | 213 |
| 17 | 80/20:97.5/2.5[b] | 4.9 | 4.8 |  | 212 |
| 18 | ODPA/PMDA/MPBTDA:RODA |  |  |  |  |
|  | 70/20/10:100 |  | 5.2 | 5.4 |  |
| 19 | ODPA/PMDA:RODA/RDEDA |  |  |  |  |
|  | 80/20:90/10 |  | 5.6 | 4.6 |  |

[a]Bond failure between polyimide and adhesive
[b]Bond failure between copper and adhesive
[c]Maximum bond strength before the base film tears.

TABLE II

PEEL STRENGTH OF THERMALLY CONVERTED ADHESIVE ON CORONA TREATED 2 mil PMDA/ODA POLYIMIDE FILM

| Example No. | Adhesive Composition (mole %) | Peel Strength (pli) 250° C. | 300° C. | 350° C. | Tg (°C.) |
|---|---|---|---|---|---|
|  | ODPA/PMDA:RODA |  |  |  |  |
| 20 | 80/20:100 | 7.7 | 6.5[c] | 6.3[c] | 225 |
|  | ODPA/PMDA:RODA/SiODA |  |  |  |  |
| 21 | 80/20:95/5[b] | 9.0 | 10.0 |  | 215 |
| 22 | 80/20:90/10[a] | 7.5 | 9.5[c] |  | 213 |
| 23 | 80/20:97.5/2.5[b] | 4.9 | 6[c] |  | 212 |
|  | ODPA:RODA/HMD |  |  |  |  |
| 24 | 100:90/10[a] |  | 7[c] |  | 209 |
|  | ODPA/6FDA:RODA |  |  |  |  |
| 25 | 80/20:100[a] | 5.0 | 5.1 | 5.2 | 227 |
|  | ODPA/PMDA:RODA/HMD |  |  |  |  |
| 26 | 80/20:80/20[a] |  | 6[c] |  | 204 |
|  | ODPA/BTDA:RODA |  |  |  |  |

TABLE II-continued
PEEL STRENGTH OF THERMALLY CONVERTED ADHESIVE ON CORONA TREATED 2 mil PMDA/ODA POLYIMIDE FILM

| Example No. | Adhesive Composition (mole %) | Peel Strength (pli) 250° C. | 300° C. | 350° C. | Tg (°C.) |
|---|---|---|---|---|---|
| 27 | 80/20:100 ODPA/PMDA:RODA/DABA | | 5.6 | Film Breaks | |
| 28 | 80/20:80/20 ODPA/BTDA:RODA/SiODA | | 9.0 | 7.2 | 236 |
| 29 | 80/20:95/5 ODPA/PMDA:RODA/DABA/SiODA | | 4.6 | 5.5 | 209 |
| 30 | 80/20:75/20/5 | | 3.5 | 8.0 | 215 |

[a]Bond failure between Polyimide and Adhesive
[b]Bond failure between Copper and Adhesive
[c]Maximum bond strength before the base film tears

EXAMPLES 31–55

Polyamic acid solutions were prepared as described in Examples 1 to 30 and coated on a polyamic acid "green film" derived from reaction of pyromellitic dianhydride and 4,4'-diaminodiphenyl ether. The coated polyimide film was heated at 80° C. for 20 minutes to remove most of the solvent, placed on a pin frame and dried and cured 160°–260° C. for 90 minutes followed by 5 minutes at 400° C.

Copper-clad polyimide laminates were prepared as previously described and peel strengths were determined. Results are given in Table III.

EXAMPLE 56

A copolyamic acid containing 80 mole % ODPA, 20 mole % PMDA and 100 mole % RODA was prepared as previously described and coated and cured on a "green" film, a "gel" film and a fully cured polyimide film derived from reaction of PMDA and ODA. Properties of the ODPA/PMDA/RODA adhesive are given in Table IV.

Polyimide copper-clad laminates were prepared using both roll-annealed (RA), electrodeposited (ED) and brass-treated (JTC) copper foils. Peel strength results are given in Table V.

TABLE III
Peel Strength of Thermally Converted Adhesive on PMDA/ODA Polyimide "Green" Film

| Example No. | Adhesive Composition (mole %) | Peel Strength (pli) 250° C. | 300° C. | 350° C. | Tg (°C.) |
|---|---|---|---|---|---|
| | ODPA/RODA | | | | |
| Control | 100:100 | | | 9.0 | 215 |
| | ODPA:RODA/SiODA | | | | |
| 31 | 100:95/5 | | | 4.5 | 202 |
| 32 | 100:90/10 | | | 6.0 | 190 |
| | ODPA/PMDA:RODA | | | | |
| 33 | 70/30:100 | | | 9.5 | 220 |
| 34 | 80/20:100 | | | 11 | 225 |
| 35 | 90/10:100 | | | 10.5 | 222 |
| | ODPA:RODA/HMD | | | | |
| 36 | 100:90/10 | | | 10.5 | 209 |
| 37 | 100:80/20 | | | Film Breaks | 201 |
| | ODPA/6FDA:RODA | | | | |
| 38 | 90/10:100 | | | 9 | 221 |
| 39 | 80/20:100 | | | 8.5 | 227 |
| 40 | 70/30:100 | | | 9 | 232 |
| | ODPA/PMDA:RODA/SiODA | | | | |
| 41 | 80/20:95/15 | | | 4.5 | 215 |
| 42 | 80/20:90/10 | | | 4.0 | 213 |
| 43 | 80/20:97.5/2.5 | | | 4.5 | 212 |
| | ODPA/BPDA:RODA | | | | |
| 44 | 80/20:100 | | 9.0 | 10.0 | 224 |
| | ODPA/BTDA:RODA | | | | |
| 45 | 80/20:100 | | 8.0 | 8.5 | 224 |
| | ODPA:RODA/PPD | | | | |
| 46 | 100:80/20 | | 8.0 | 9.5 | 228 |
| | ODPA:RODA/ODA | | | | |
| 47 | 100:80/20 | | 7.0 | 7.5 | 227 |
| | ODPA/PMDA:RODA/ODA | | | | |
| 48 | 80/20:80/20 | | 5.0 | 10[c] | 235 |
| | ODPA/DSDA:RODA | | | | |
| 49 | 80/20:100 | | 7[c] | 8.5 | 225 |
| | ODPA/PMDA:RODA/BAPE | | | | |
| 50 | 80/20:70/30 | | | 7.7 | 228 |
| | ODPA/PMDA:RODA/MPD | | | | |
| 51 | 80/20:70/30 | | | 6.6 | 247 |

TABLE III-continued

Peel Strength of Thermally Converted Adhesive on PMDA/ODA Polyimide "Green" Film

| Example No. | Adhesive Composition (mole %) | Peel Strength (pli) 250° C. | 300° C. | 350° C. | Tg (°C.) |
|---|---|---|---|---|---|
| 52 | ODPA/PMDA/MPBTDA:RODA 70/20/10:100 | | 7.5 | 9.0 | |
| 53 | ODPA/PMDA:RODA/RDEDA 80/20:90/10 | | 7.5 | 9.6 | |
| 54 | ODPA/PMDA:RODA/RDEDA 80/20:95/5 | | 10.0 | | |
| 55 | ODPA/PMDA:CODA 80/20:100 | | 8.2 | 10.2 | |

<sup>a</sup>Maximum bond strength before the base film tears.

TABLE IV

| PROPERTIES OF ADHESIVE ODPA/PMDA/RODA FILM | |
|---|---|
| Tensile Strength | 11 kpsi |
| Elongation | 23% |
| Modulus | 345 |
| Shrinkage at 200° C. | 0.2% |
| Glass Transition Temperature | 220° C. |
| Dielectric Constant | 3.38 |
| Dielectric Strength | 2.96 volts/mil |
| Dissipation Factor | 0.0016 |
| Coefficient of Thermal Expansion (CTE) | 60 PPM |
| Water Absorption | 0.93% |
| Density | 1.362 |
| Tear Strength | 5.8 gm/mil |
| Moisture Content | 0.163% |

TABLE V

PEEL STRENGTH OF ODPA/PMDA:RODA ADHESIVE ON VARIOUS COPPER FOILS

| ADHESIVE | COATED ON AND CURED | PEEL STRENGTHS (pli) | | | |
|---|---|---|---|---|---|
| | | RA | RA-JTC | ED | ED-JTC |
| ODPA/PMDA:RODA (80/20:100) | "GREEN" FILM | 11 | 7.5 | 24 | 12.5 |
| | "GEL" FILM | 9.5 | 11.5 | 22 | 20 |
| | FULLY CURED FILM | 8 | * | | |

*Base film broke; could not determine peel strength.

EXAMPLES 57-61

Various copper foils were used to make polyimide laminates with an ODPA/PMDA:RODA (80/20:100) adhesive as shown in Table VI.

The results show that the arithmetic average roughness (AA) of the foil influences the measured peel strength. Over the range of roughness tested, the ODPA/PMDA:RODA adhesive showed a 0.2 lb/in increase in peel strength for each microinch increase in AA. The oxide and brass treatments both produced a similar increase in peel strength over the measured with an untreated surface.

TABLE VI

EFFECT OF COPPER SURFACE TREATMENT ON PEEL STRENGTH OF ODPA/PMDA:RODA (80/20:100) ADHESIVE

| Ex. No. | Copper Foil | AA (Micro-inches) | Peel Strength (pli) ODPA/PMDA:RODA (80/20:100) | | |
|---|---|---|---|---|---|
| | | | Green Film | Gel Film | Cured Film |
| 57 | RA/oxide (Brightside) | 6.7 | 4.5 | — | — |
| 58 | RA/oxide | 6.6 | 11 | 9.5 | 8.0 |
| 59 | RA/brass | 10.8 | 7.5 | 11.5 | — |
| 60 | ED/brass | 51.3 | 12.5 | 20 | — |
| 61 | ED/oxide | 72.6 | 24.0 | 22 | — |

EXAMPLES 62-65

Polyamic acid solutions were prepared as described in Examples 1 to 30 and coated on a polyamic acid "gel film" prepared by chemical conversion of pyromellitic dianhydride and 4,4'-diaminodiphenyl ether. The coated gel film was heated at 80° C. for 20 minutes to remove the solvent, placed on a pin frame and dried at 160°-260° C. for 90 minutes.

Copper-clad laminates were prepared as previously described and peel strengths were determined. Results are given in Table VII.

TABLE VII

PEEL STRENGTH OF ADHESIVES ON PMDA/ODA GEL FILM

| Example | Adhesive composition (mole %) | Peel Strength* (pli) 300° C. | 350° C. |
|---|---|---|---|
| 62 | ODPA:RODA/HMD 100:80/20 | 8.0 | 6.5 |
| 63 | ODPA/BPDA:RODA 80/20:100 | 5.5 | |
| 64 | ODPA:RODA/PPD 100:80/20 | 4.5 | 8.0 |
| 65 | ODPA/PMDA:CODA 80/20:100 | 6.0 | 7.0 |

*Bond failure between copper and adhesive.

What is claimed is:

1. A flexible polyimide metal-clad laminate adapted for use in a flexible printed circuit and in tape automated bonding comprising at least one layer of a metallic substrate and at least one layer of an aromatic polyimide, said layer of aromatic polyimide being bonded on at least one side to said layer of metallic substrate with a peel strength of at least 4 pli as determined by ASTM Method IPC-TM-650, Method No. 2.4.9B, through an adhesive layer of a heat-sealable copolyimide comprising from 60 to 98 mole % of repeating imide units of the formula

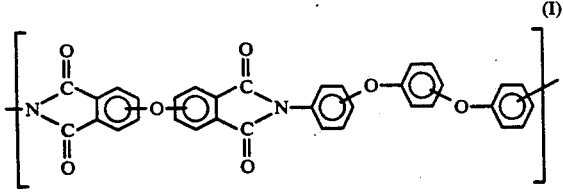

and from 2 to 40 mole % of other repeating imide units of the formula

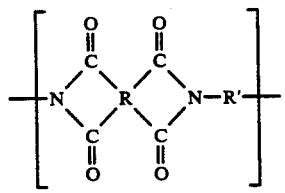

wherein R is the radical of a tetravalent organic carboxylic dianhydride selected from the group consisting of pyromellitic dianhydride, 4,4'-oxydiphthalic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2',3,3'-biphenyl tetracarboxylic dianhydride, 2,2-bis(3,4-dicarboxyphenyl)hexafluoropropane dianhydride, bis(3,4-dicarboxyphenyl)sulfone dianhydride and m-phenylene bis(trimellitate)dianhydride; and wherein R' is the radical of a divalent aromatic or aliphatic diamine selected from the group consisting of p-phenylene diamine, hexamethylene diamine, heptamethylene diamine, octamethylene diamine, 4,4'-diaminodiphenyl ether, 3,4'-diaminodiphenyl ether, 1,3-bis(4-aminophenoxy)benzene, 1,2-bis(4-aminophenoxy)benzene, 1,3-bis(4-aminobenzoyloxy)benzene, 4,4'-diaminobenzanilide, 4,4'-bis(4-aminophenoxy)phenyl ether and a polysiloxane diamine, provided that said repeating imide units of formula (I) are different from said repeating imide units of formula (II).

2. The flexible polyimide metal-clad laminate of claim 1 wherein the aromatic polyimide is derived from 4,4'-diaminodiphenyl ether and pyromellitic dianhydride.

3. The flexible polyimide metal-clad laminate of claim 1 wherein the heat-sealable adhesive is a copolymer of 70 to 95 mole % oxydiphthalic dianhydride, 5 to 30 mole % pyromellitic dianhydride and 100 mole % of 1,3-bis(4-aminophenoxy) benzene.

4. The flexible polyimide metal-clad laminate of claim 2 wherein the heat-sealable adhesive is a copolymer of 70 to 95 mole % oxydiphthalic dianhydride, 5 to 30 mole % of pyromellitic dianhydride and 100 mole % of 1,3-bis(4-aminophenoxy) benzene.

5. The flexible polyimide metal-clad laminate of claim 3 wherein the metallic substrate is copper.

6. The flexible polyimide metal-clad laminate of claim 1 wherein the heat-sealable adhesive is a copolymer of 80 mole % oxydiphthalic dianhydride, 20 mole % pyromellitic dianhydride, 90 to 98 mole % of 1,3-bis(4-aminophenoxy) benzene and 2 to 10 mole % of polysiloxane diamine.

7. The flexible polyimide metal-clad laminate of claim 2 wherein the heat-sealable adhesive is a copolymer of 80 mole % oxydiphthalic dianhydride, 20 mole % pyromellitic dianhydride, 90 to 98 mole % of 1,3-bis(4-aminophenoxy) benzene and 2 to 10 mole % of polysiloxane diamine.

8. The flexible polyimide metal-clad laminate of claim 1 wherein the heat-sealable adhesive is a copolymer of 100 mole % oxydiphthalic dianhydride, 80 to 95 mole % of 1,3-bis(4-aminophenoxy) benzene and 5 to 20 mole % hexamethylene diamine.

9. The flexible polyimide metal-clad laminate of claim 2 wherein the heat-sealable adhesive is a copolymer of 100 mole % oxydiphthalic dianhydride, 80 to 95 mole % of 1,3-bis(4-aminophenoxy) benzene and 5 to 20 mole % hexamethylene diamine.

10. The flexible polyimide metal-clad laminate of claim 1 wherein the heat-sealable adhesive is a copolymer of 100 mole % oxydiphthalic dianhydride, 70–95 mole % 1,3-bis(4-aminophenoxy) benzene and 5–30 mole % paraphenylene diamine.

11. The flexible polyimide metal-clad laminate of claim 2 wherein the heat-sealable adhesive is a copolymer of 100 mole % oxydiphthalic dianhydride, 70–95 mole % 1,3-bis(4-aminophenoxy) benzene and 5–30 mole % paraphenylene diamine.

12. The flexible polyimide metal-clad laminate of claim 1 wherein the heat-sealable adhesive is a copolymer of 70–95 mole % oxydiphthalic dianhydride, 5–30 mole % biphenyltetracarboxylic acid dianhydride and 100 mole % 1,3-bis(4-aminophenoxy) benzene.

13. The flexible polyimide metal-clad laminate of claim 2 wherein the heat-sealable adhesive is a copolymer of 70–95 mole % oxydiphthalic dianhydride, 5–30 mole % benzophenonetetracarboxylic acid dianhydride and 100 mole % 1,3-bis(4-aminophenoxy) benzene.

14. A flexible polyimide metal-clad laminate comprising a metallic substrate bonded on at least one side with a peel strength of at least 4 pli as determined by ASTM Method IPC-TM-650, Method No. 2.4.9B to a heat-sealable copolyimide adhesive comprising from 60 to 98 mole % of repeating imide units of the formula

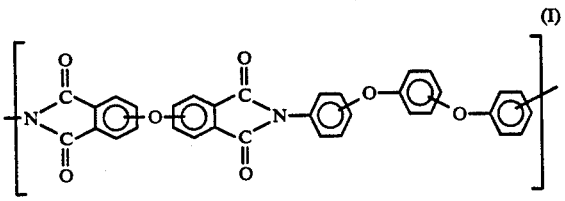

and from 2 to 40 mole % of other repeating imide units of the formula

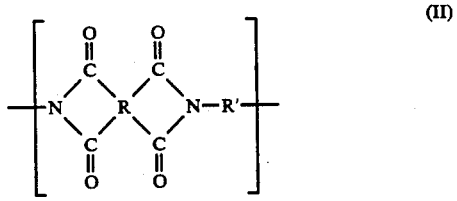

wherein R is the radical of a tetravalent organic carboxylic dianhydride selected from the group consisting of pyromellitic dianhydride, 4,4'-oxydiphthalic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2',3,3'-biphenyl tetracarboxylic dianhydride, 2,2- bis(3,4-dicarboxyphenyl)-hexafluoropropane dianhydride, bis(3,4-dicarboxyphenyl)-sulfone dianhydride and m-phenylene bis(trimellitate)-dianhydride; and wherein R' is the radical of a divalent aromatic or aliphatic diamine selected from the group consisting of p-phenylene diamine, hexamethylene diamine, heptamethylene diamine, octamethylene diamine, 4,4'-diaminodiphenyl ether, 3,4'-diaminodiphenyl ether, 1,3-bis(4-aminophenoxy)benzene, 1,2-bis(4-aminophenoxy)benzene, 1,3-bis-(4-aminobenzoyloxy)benzene, 4,4'-diaminobenzanilide, 4,4'-bis(4-aminophenoxy)phenyl ether and a polysiloxane diamine, provided that said repeating imide units of formula (I) are different from said repeating imide units of formula (II).

15. The flexible metal-clad laminate of claim 14 wherein the metallic substrate is copper.

16. The flexible metal-clad laminate of claim 15 wherein the heat-sealable adhesive is a copolymer of 70 to 95 mole % oxydiphthalic dianhydride, 5 to 30 mole % pyromellitic dianhydride and 100 mole % of 1,3-bis-(4-aminophenoxy) benzene.

* * * * *